United States Patent [19]

Maudsley

[11] Patent Number: 4,703,267
[45] Date of Patent: Oct. 27, 1987

[54] HIGH DYNAMIC RANGE IN NMR DATA ACQUISITION

[75] Inventor: Andrew A. Maudsley, New York, N.Y.

[73] Assignee: Advanced NMR Systems, Inc., Woburn, Mass.

[21] Appl. No.: 756,066

[22] Filed: Jul. 17, 1985

[51] Int. Cl.$^4$ ............................................. G01R 33/20
[52] U.S. Cl. .................................. 324/307; 324/314; 324/309
[58] Field of Search ............... 324/307, 309, 310, 312, 324/314, 313

[56] References Cited

U.S. PATENT DOCUMENTS 4,291,272 9/1981 Hofer et al. ........................ 324/313
4,528,509 7/1985 Radda et al. ........................ 324/309

Primary Examiner—Stewart J. Levy
Assistant Examiner—Kevin D. O'Shea
Attorney, Agent, or Firm—Ostrolenk, Faber, Gerb & Soffen

[57] ABSTRACT

In order to increase the efficiency with which NMR information is received, the peak amplitude of the received NMR signal is reduced. This reduction is obtained by varying the phase of the nuclear spin systems which produce the NMR signal. The phase variation may be obtained by applying a spatially inhomogeneous rf pulse. It may alternatively be obtained by applying a tailored rf pulse having either an amplitude spectrum or a phase spectrum which varies with frequency. It may alternatively be obtained by applying gradient pulses. The phase variation may be produced at one or more of several times during the data acquisition. In addition to reducing the peak amplitude of the NMR signal, the phase variation results in reduced noise from an FFT performed during processing.

28 Claims, 30 Drawing Figures

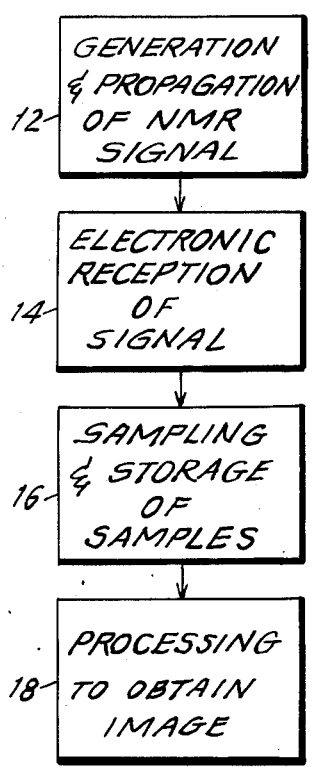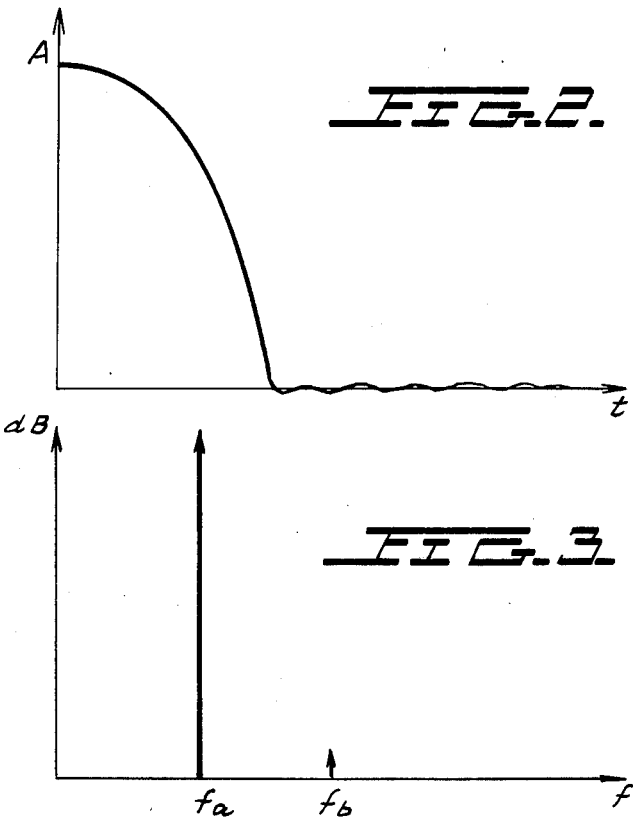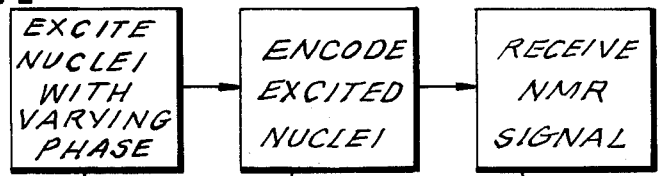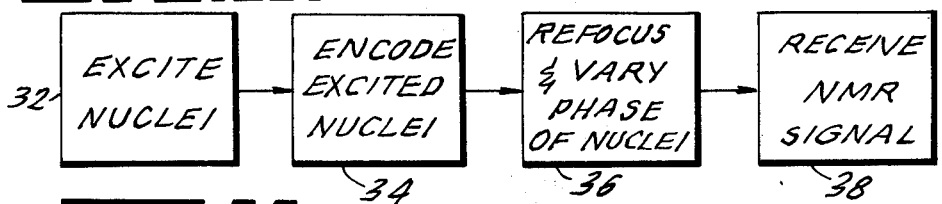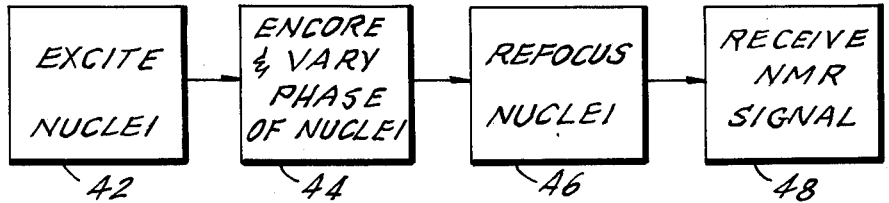

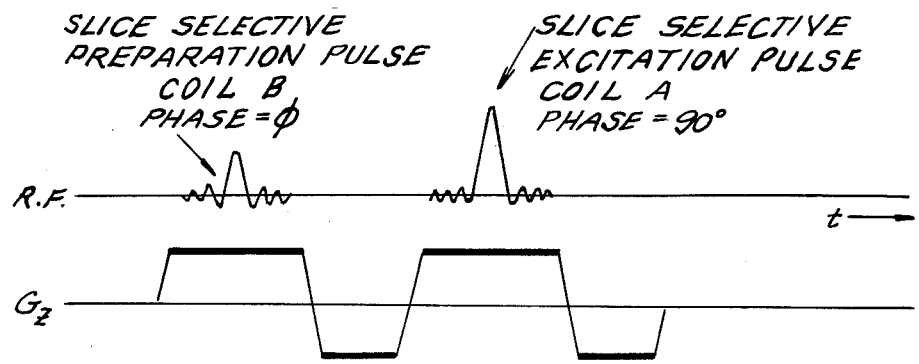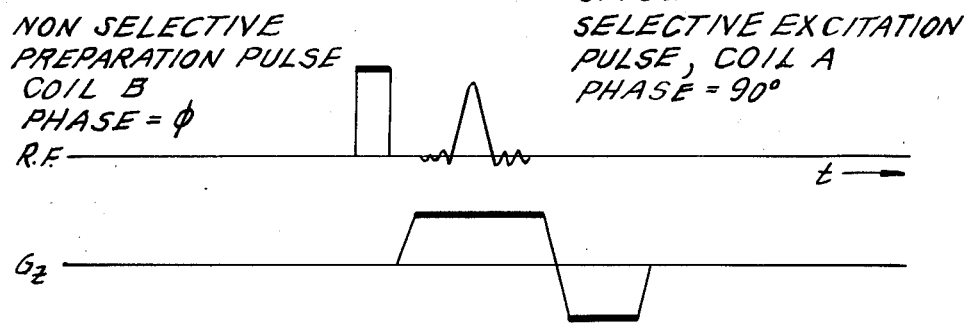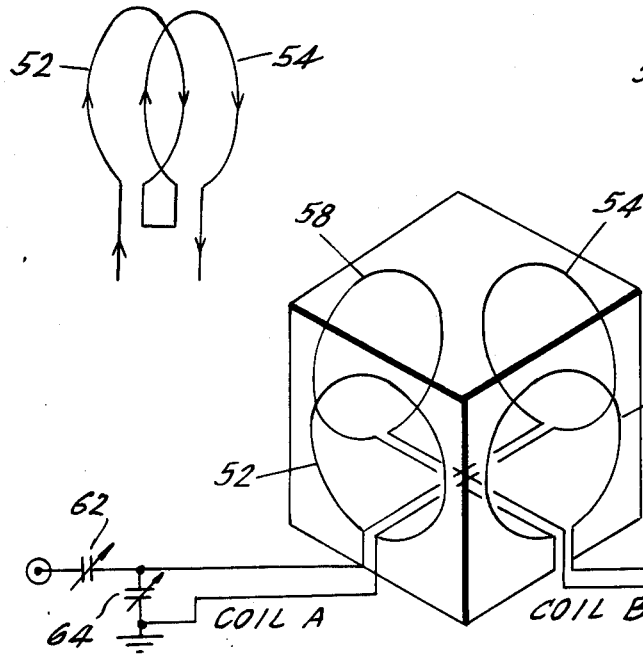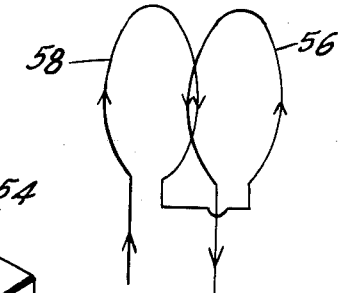

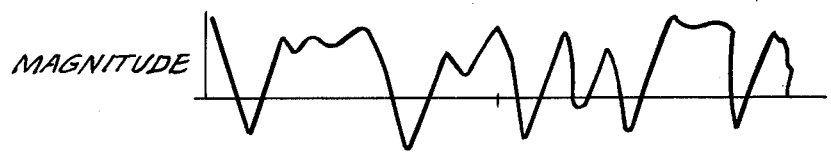
FIG. 10A.
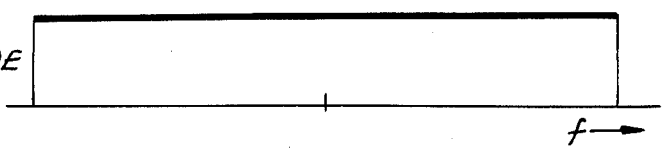
FIG. 10B.
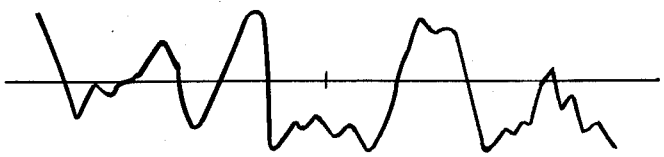
FIG. 11.
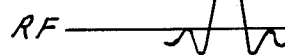
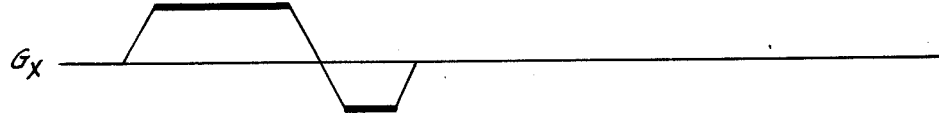
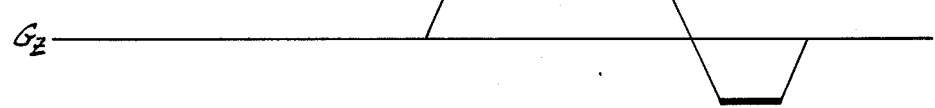

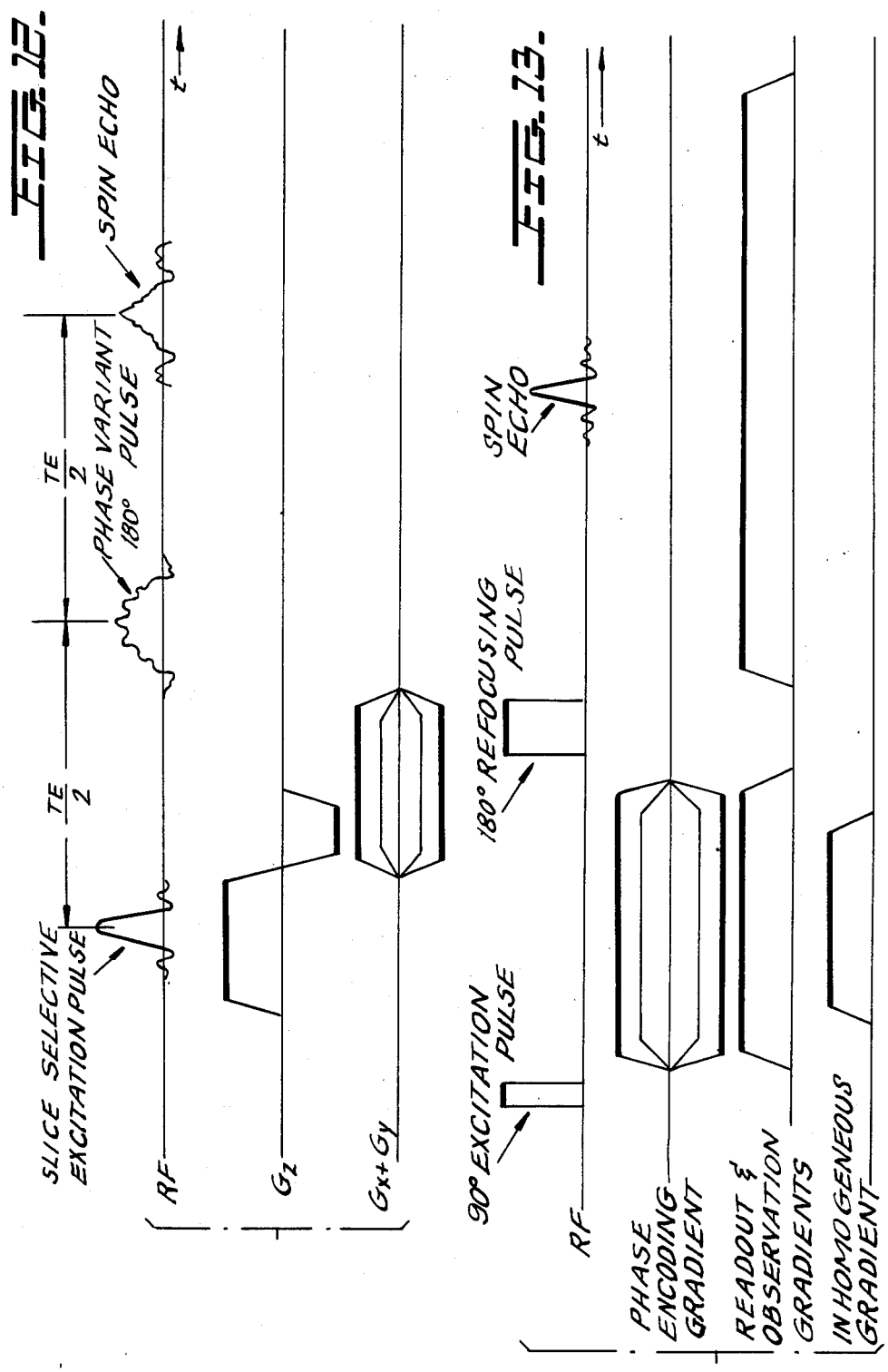

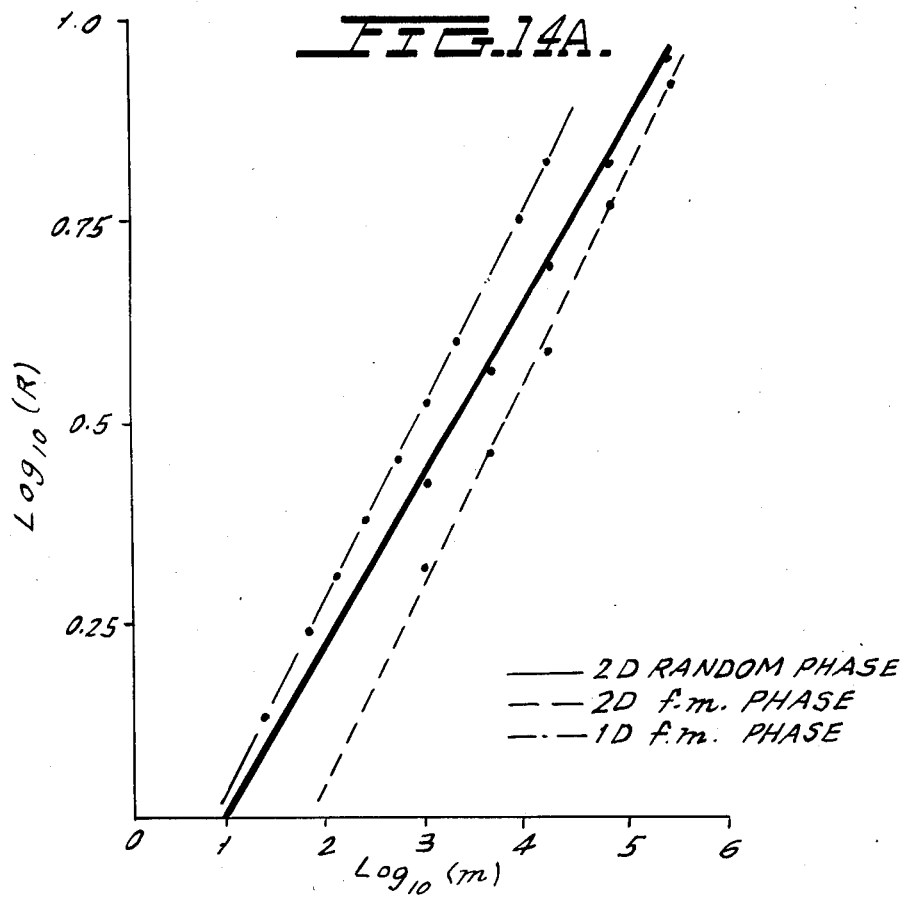
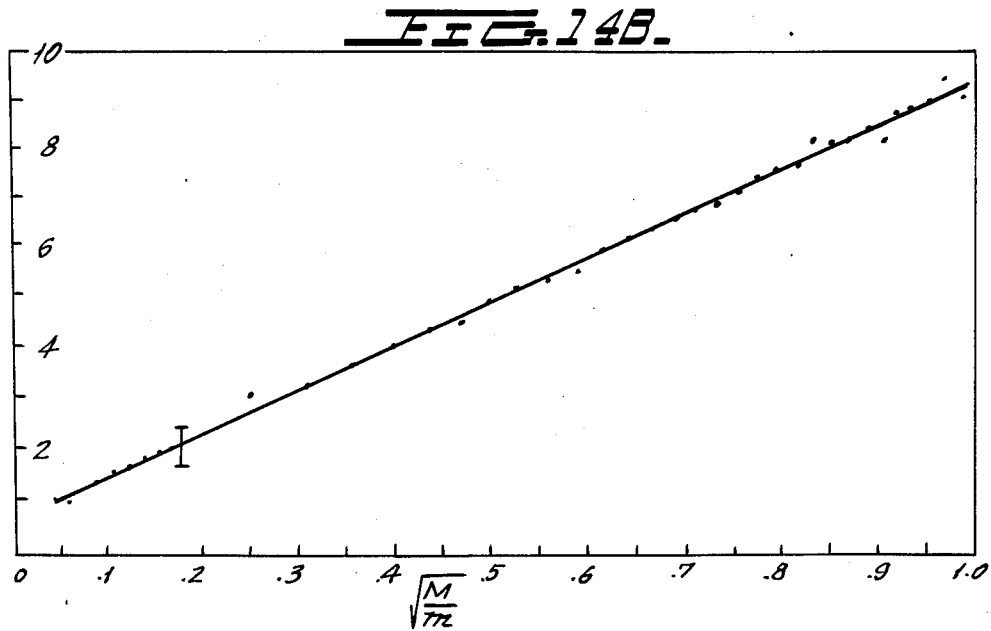

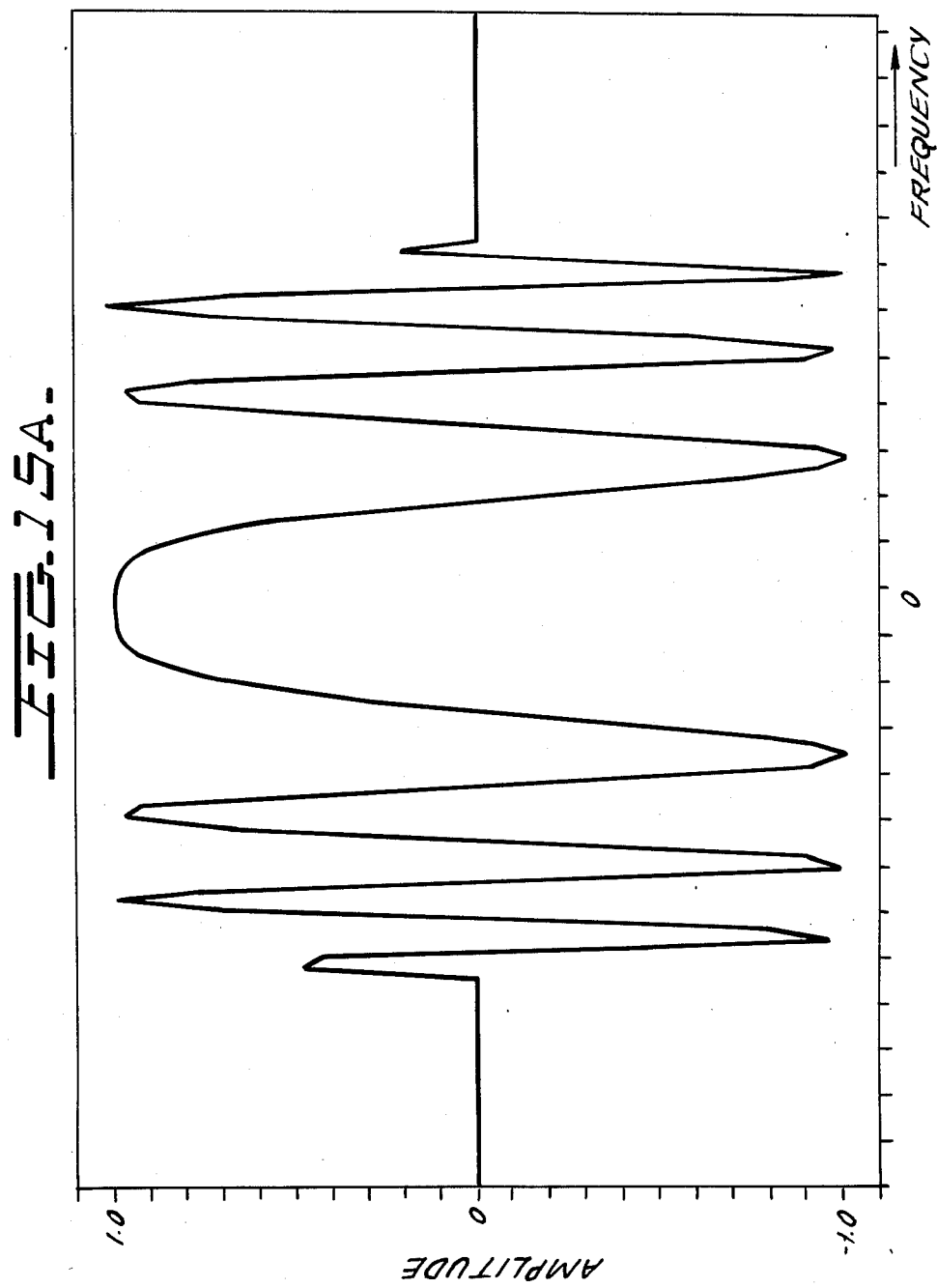

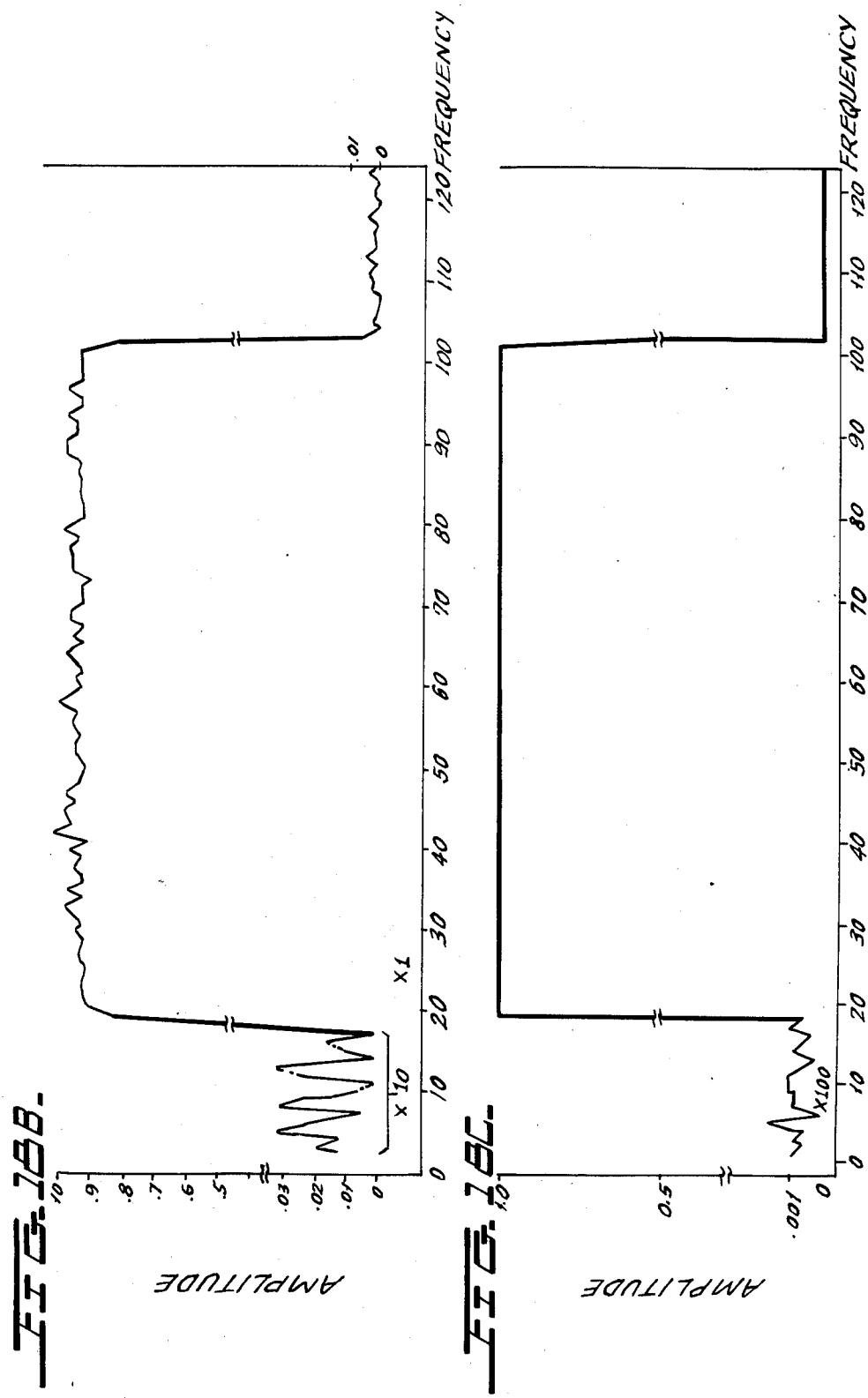

HIGH DYNAMIC RANGE IN NMR DATA ACQUISITION

BACKGROUND OF THE INVENTION

1. Field of the Invention

The present invention relates to techniques for retrieving information about an object through nuclear magnetic resonance (NMR) signals. More specifically, this invention relates to techniques for increasing the amount of information which can be received from a single NMR signal.

2. Description of the Prior Art

Any information system has a finite dynamic range, which may be expressed in decibels, between maximum and minimum signal amplitudes which the system can receive, process, or transmit. For example, Tomlinson, U.S. Pat. No. 4,034,191, relates to a spectrometer, which transmits a series of pulsed signals into an object being analyzed. Tomlinson discusses a technique for reducing the peak power requirements of the transmitter to fit within a given dynamic range by modulating the pulse height or pulse width of the pulsed signals in accordance with a pseudorandom sequence, and more specifically discusses the addition of a pseudorandom phase shift component into each of the Fourier frequency components of a desired broadband excitation waveform used to modulate the pulses. This reduces the peak pulsed power requirement because the peak amplitudes of the frequency components occur out of phase with each other in the modulating waveform. Also, the phases of the simultaneously excited resonance spectral lines are scrambled.

In many NMR applications, rather than applying a series of pulses, during each of which a simultaneous NMR signal is received as in Tomlinson, a pulse and magnetic field gradient sequence is applied to obtain one or more NMR signals during a subsequent time interval. Although these NMR signals may have relatively high peak amplitudes, the average amplitude of each signal over the full detection period is quite low. In Fourier transform (FT) NMR imaging, for example, a transient response from a large number of spin systems is received as a function of time, and the maximum amplitude of this transient response is determined by the total number of spin systems which have been excited. Detailed information about the NMR spectrum is contained in low amplitude components of the spin response, however, and may be obtained by Fourier transformation of the detected time varying signal, provided that the dynamic range of the NMR imaging system is large enough to include both the peak amplitude of the transient response and the much lower amplitude components of the spin response. During most of its duration, the spin response will have a very low amplitude, particularly when the signal must be sampled for a long time period in order to obtain detailed frequency information while the transverse relaxation of the spin systems according to the time constant $T_2^*$ results in a significant loss of signal amplitude over the sampling period.

Therefore, it would be advantageous to have techniques making it possible to reduce the peak amplitude of the received NMR signal in NMR imaging. Reducing the peak amplitude would reduce the dynamic range of the information in a given NMR signal. Such an NMR signal could contain information filling the dynamic range of the NMR imaging system, thereby making it possible to receive more information using that system.

SUMMARY OF THE INVENTION

The present invention provides techniques for reducing the peak amplitude of a received NMR signal. In addition, the present invention provides techniques for reducing the peak amplitude of an NMR signal which includes phase encoded NMR information. The present invention thus provides techniques for reducing the peak amplitude of a received NMR signal. These techniques are particularly effective when used in NMR imaging, in which spatial information is phase encoded in the received NMR signal.

The present invention also provides techniques for scrambling the phase of atomic nuclei by applying a pulse having a constant amplitude across its range of frequencies but having a phase which varies as a function of frequency. The techniques according to the present invention also reduce the noise introduced by digitization and data processing during the imaging process.

Some aspects of the present invention are based on the discovery that the phase encoding of NMR information may be combined with techniques which vary the phase of atomic nuclei to reduce the peak amplitude of a received NMR signal. Some aspects of the present invention are also based on the discovery of specific techniques for varying the phase of atomic nuclei which improve the dynamic range of an NMR imaging system.

A method of receiving NMR signals according to the invention includes exciting atomic nuclei of an object during a first time interval to produce an NMR signal during a second time interval following the first time interval. The phase of the nuclei of at least some of the atoms of the object is varied to reduce the ratio of the peak amplitude of the NMR signal to its average power. The NMR signal is received during the second time interval.

One technique for varying the phase of the nuclei is to apply a spatially inhomogeneous radiofrequency (rf) pulse to the object. After this pulse, a homogeneous rf pulse may be applied, the two pulses together placing the nuclei in an excited state from which they will decay to produce an NMR signal. In addition, the rf pulses may be applied as spatially selective pulses during a pulsed gradient field so that a slice of the object will be selected.

Another technique of varying the phase of the nuclei includes applying a phase scrambling tailored rf pulse in which either the phase or the amplitude varies with frequency. This phase scrambling rf pulse may be generated by first defining its phase spectrum and amplitude spectrum and by then transforming the phase spectrum and the amplitude spectrum with a Fourier transform or the like to obtain a time-varying rf pulse waveform having real and imaginary components to be applied to the object. The phase scrambling rf pulse may have an amplitude which varies with frequency and may be applied during a pulsed gradient field in the same direction or orthogonal to a slice selecting pulsed gradient field applied during a subsequent homogeneous rf excitation pulse. The phase scrambling rf pulse may alternatively have a phase which varies as a function of frequency and may be applied as a non-selective excitation pulse or as a refocusing pulse. The phase of a phase scrambling rf pulse may vary with frequency according to a slowly varying random phase function obtained by interpolation or it may vary according to a frequency modulated phase function. In either case, the function must be one which results in a reduced ratio of peak amplitude to average power for the NMR signal. A specific example of such a function is as follows:

$$\text{phase}(n) = \frac{2\pi a |n|^b}{m}$$

where a and b are coefficients, m is a number of phase distinct segments of the range and n takes the integer values from $-(m/2)+1$ to $m/2$.

Another technique of varying the phase is to time the application of a pulsed gradient field in order to produce a phase variation. To distinguish the resulting phase variation from the phase encoding of NMR information, the pulsed gradient field may provide high order gradient components.

In order to correct for the phase variations in the received NMR signal resulting from varying the phase of the nuclei, the magnitude of the received NMR signal may be obtained. Another technique for correcting the phase variations is to obtain an image containing a plurality of points from the received NMR signal and to correct the phase variations at each point of the image.

By reducing the peak amplitude of the received NMR signal, the techniques according to the invention make it possible to detect a larger range of amplitudes contained in the NMR signal. Specifically, the gain of the receiver may be increased because the peak amplitude is reduced. As a result, it may be possible, for example, to detect small signals such as those resulting from the protons in lactate, in the presence of large signals such as those resulting from the protons in water and fat. As a result, NMR spectroscopic imaging may provide substantially more information about substances in the body which could not previously be included in NMR imaging due to dynamic range limitations.

Other objects, features and advantages of the invention will be apparent from the following description, together with the accompanying drawings and the appended claims.

BRIEF DESCRIPTION OF THE DRAWINGS

FIG. 1 is a block diagram shown the stages of an NMR imaging system which may limit the dynamic range.

FIG. 2 shows a time varying NMR signal including large and small amplitude components.

FIG. 3 shows a frequency spectrum of a signal like that in FIG. 2.

FIG. 5A is a block diagram showing the functions performed during a method according to the invention.

FIG. 5B is a block diagram showing the functions performed during another method according to the invention.

FIG. 5C is a block diagram showing the functions performed during another method according to the invention.

FIG. 8A is a timing diagram showing a pulse sequence using the arrangement of coils of FIG. 6.

FIG. 8B is an alternative pulse sequence using the coil arrangement of FIG. 6.

FIG. 9A is schematic drawing of an rf coil for producing a homogeneous field which may be used in the coil arrangement of FIG. 6.

FIG. 9B is a schematic drawing of an rf coil for producing an inhomogeneous field which may be used in the coil arrangement of FIG. 6.

FIG. 9C is a more detailed schematic drawing showing the mounting and circuitry of the coils of FIGS. 9A and 9B.

FIG. 10A shows the amplitude and phase spectra of an amplitude varient pulse which may be used for phase scrambling according to the invention.

FIG. 10B shows the amplitude and phase spectra of a phase variant pulse which may be used for phase scrambling according to the invention.

FIG. 11 is a timing diagram of a pulse and gradient sequence which may be used with an amplitude variant pulse for phase scrambling according to the invention.

FIG. 12 is a pulse and gradient sequence which may be used with a phase variant pulse for phase scrambling according to the invention.

FIG. 13 is a pulse and gradient sequence for timing a gradient pulse according to the invention.

FIG. 14A is a graph comparing the peak intensity of time data obtained with phase scrambling resulting from phase variant pulses according to the invention.

FIG. 14B is a graph showing the signal reduction factor for random phase scrambling with a phase variant pulse according to the invention.

FIG. 15A shows the real part of a phase modulated profile using one example of a phase variant pulse according to the invention.

FIG. 18B is a graph showing a profile similar to that of FIG. 18A obtained without phase scrambling in the conventional manner.

FIG. 18C is a graph similar to FIG. 18A showing the results obtained using phase scrambling with the magnitude being taken.

DETAILED DESCRIPTION OF THE PREFERRED EMBODIMENTS

I. Dynamic Range in NMR Imaging

Figure 4A:
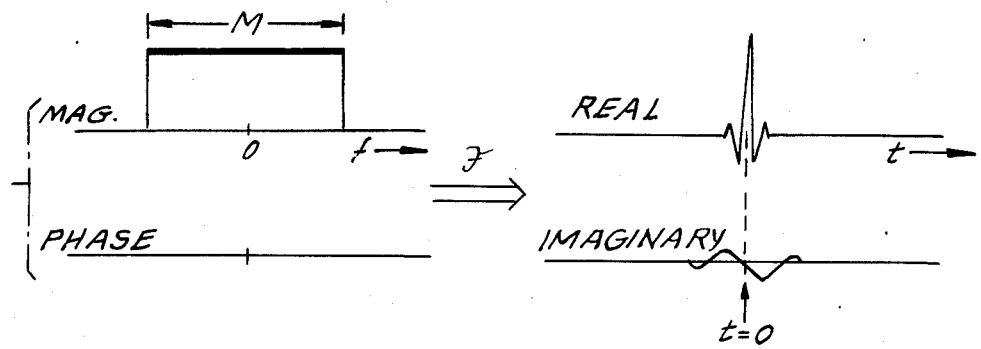
FIG. 4A shows the spectrum and time varying components of an rf pulse with constant phase.

The basic approach of NMR imaging is that information is retrieved from an object to be imaged by receiving an NMR signal, which is then sampled and processed to provide an image. FIG. 1 shows the stages of this process, during each of which a limit may be imposed on the dynamic range.

In box 12, the NMR signal is generated and propagates to the receiving equipment. As a practical matter, an extremely wide dynamic range may occur in the NMR signal. In FT NMR imaging, a transient response from all of the spin systems in an imaged portion of an object is generated, the maximum amplitude depending on the total number of spin systems which are excited. As the transient response decays from its peak amplitude, low amplitude fluctuations occur which contain the detailed information on the NMR spectrum of the nuclear spin systems, and this detailed information, if received and sampled, may be retrieved by a Fourier transformation or the like.

FIGS. 2 and 3 illustrate graphically why the detailed information which is desired may have a very low amplitude in relation to the peak amplitude of the NMR signal. An example of a time varying NMR signal is shown in FIG. 2, decaying from its peak amplitude over time. The decay is characterized by a number of time constants, the most important of which are the transverse relaxation time $T_2$ and the longitudinal relaxation time $T_1$, which is usually longer than $T_2$. In addition, the inhomogeneity of the magnetic field being used results in a substantially shorter actual relaxation time $T_2^*$, which leads to the rapid decay from the peak amplitude shown in FIG. 2. A portion of the spectrum of the NMR signal in FIG. 2 is shown in FIG. 3, showing the amplitude in dB of two frequency components, $f_a$ and $f_b$, of the NMR signal in FIG. 2. As shown in FIG. 3, the amplitude of frequency component $f_a$ is far greater than that of frequency component $f_b$, so that if the nuclei which are resonant at the frequency $f_a$ emit their signals substantially in phase, the resulting NMR signal will have an extremely large peak amplitude, making detection of the signal at frequency $f_b$ possible only with an extremely high dynamic range. Similarly, as shown in FIG. 2, the time varying signal goes relatively quickly from a very high amplitude to an amplitude near zero, so that if it is desired to sample over a relatively long period of time in order to obtain greater spectral resolution, it will also be necessary to obtain the signal with an extremely high dynamic range. Therefore, the dynamic range resulting from the generation of the NMR signal in box 12 in FIG. 1 will typically be extremely high in NMR imaging. As discussed below, the high field strengths used in imaging large objects like the body result in high maximum signal amplitude and low relative noise.

As also shown in step 12, the NMR signal, once generated, propagates to the receiving equipment, which typically includes an rf coil and associated electronic circuitry for amplifying the signal received by the rf coil. The propagation of the NMR signal to the rf coil and reception by the rf coil, however, typically do not limit the signal amplitudes, so that the dynamic range of the signal can remain extremely high.

In box 14, the NMR signal received by the rf coil passes through the receiver electronics discussed briefly above. This is a limitation on the dynamic range, because the currently available receivers have a limited dynamic range.

After the signal has been received, it is sampled and the samples are stored, as shown in box 16 in FIG. 1. This function is performed in part using an analog-to-digital converter (ADC), and currently available ADC's have a resolution as high as 16 bits, equivalent to 90 dB of dynamic range, although ADC's with such a high dynamic range are costly. This range is somewhat greater than currently available receiver electronics, so that it does not really limit the dynamic range of the sampled and stored signal. This dynamic range is smaller, however, than the maximum dynamic range which may occur in an NMR signal so that it could become a limitation if the dynamic range of the receiver electronics were improved.

Finally, in box 18, the samples of the signal are processed to obtain an NMR image of the object. This process typically includes a Fast Fourier Transform (FFT), which itself introduces some noise into the information, reducing its dynamic range. The noise introduced by the FFT depends upon the digitization accuracy, roundoff errors, the methods of scaling the data during the FFT and the nature of the data itself. Because the noise introduced by the FFT is dependent upon the nature of the data itself, this aspect of the dynamic range, as discussed in greater detail below, may be improved through appropriate techniques.

Dynamic range is as particular problem in NMR imaging for several reasons. The high field strengths currently being used, which may exceed 1 Tesla and which are used for imaging large objects such as a human body, result in a strong NMR response with an excellent signal-to-noise (S/N) ratio during the NMR signal, which is known as the free induction decay (FID). Furthermore, large field gradients and field inhomogeneities exist across the object being imaged, resulting in an FID with a very rapid decay and therefore a very high ratio of peak signal power to average signal power. Finally, in medical applications of NMR imaging, it is preferable to keep the imaging times short, so that averaging of the signal in the presence of noise, a technique which increases dynamic range in conventional NMR spectroscopy, requires additional data acquisition time and is therefore undesirable.

The present invention is based on the recognition that the dynamic range problem in NMR data acquisition may be alleviated by reducing the peak amplitude of the NMR signal. The present invention is further based on the discovery that this can be done by varying the phase of the nuclear spin systems within an object being studied and that some of the techniques for varying the phase of the nuclear spin systems also reduce the noise introduced during subsequent signal processing, such as during the FFT. The present invention has particular application to NMR imaging and is further based upon the discovery that the phase may be varied even though some of the spatial information necessary for imaging is phase encoded into the nuclear spin systems.

Figure 4B:
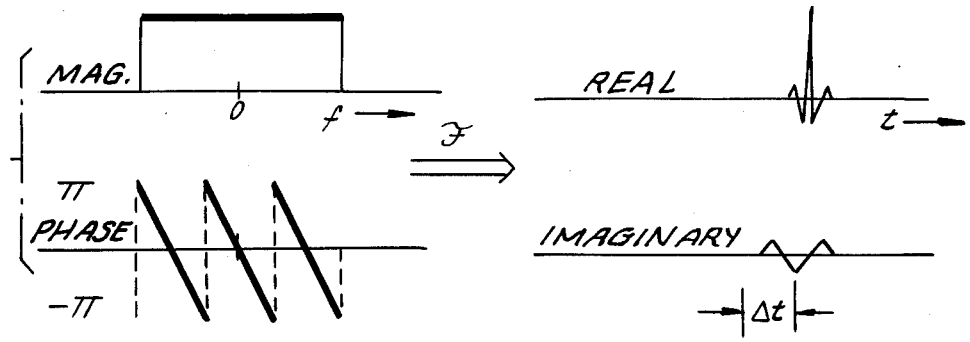
FIG. 4B shows the spectrum and time varying components of an rf pulse with linearly varying phase.
Figure 4C:
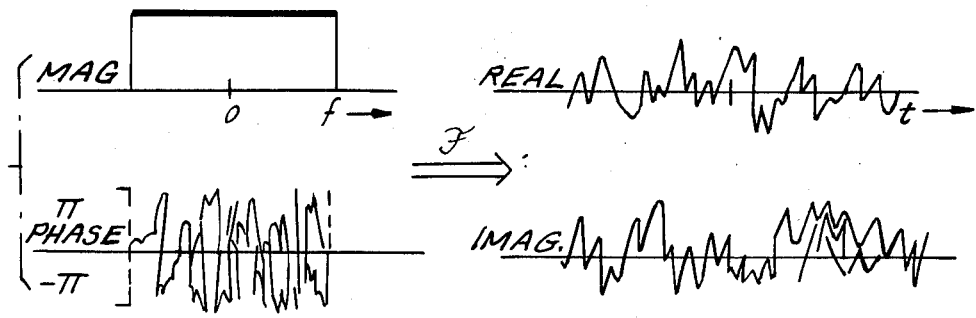
FIG. 4C shows the spectrum and time varying components of an rf pulse with random phase.

FIGS. 4A–4C illustrate graphically how the phase may be varied in order to reduce the peak amplitude of an NMR signal. In each of these examples, the amplitude and phase components of an NMR signal's frequency spectrum are shown at the left, while the corresponding real and imaginary time varying waveforms are shown at the right. In FIG. 4A, for example, the amplitude of the NMR spectrum is constant across a range of frequencies, while the phase is zero for all frequencies. The corresponding time varying waveforms, shown as an echo signal, are centered about a time which is arbitrarily defined as t=0. In FIG. 4B, the amplitude component of the spectrum is the same as FIG. 4A, but the phase component of the spectrum has a linear variation across the range of frequencies with non-zero amplitudes. This phase variation results in a shift of the center of the time varying signal by Δt, although the shapes of the real and imaginary waveforms remain the same as in FIG. 4A. In FIG. 4C, in contrast, the shape of the real and imaginary components of the time varying waveforms is changed substantially, resulting in a reduction of the peak amplitude of the real component. One spectrum of a pulse having this waveform is shown at the left in FIG. 4C, and has the same amplitude component as FIGS. 4A and 4B, but has a random phase variation across the range of frequencies in its phase component. Unlike the linear phase variation of FIG. 4B, this random phase variation and other appropriate phase variations which may be used will result in a reduction in the peak amplitude of the corresponding real waveform component.

It follows from FIG. 4C that the ratio of the peak amplitude of the received NMR signal to its average power will be reduced if the phases of the nuclear spin systems vary across the phase component of the frequency spectrum in the manner shown in FIG. 4C. During conventional NMR imaging, however, phase encoding of the nuclear spin systems will typically result in a phase component resembling that in either FIG. 4A or 4B, so that the peak amplitude of the received NMR signal will remain high. In addition to any phase encoding, therefore, it is also necessary to vary the phase of the nuclear spin systems in a manner which will reduce the peak amplitude of the resulting NMR signal.

FIGS. 5A–5C show several possible sequences of functions performed during one application of the invention, NMR imaging. Each of these sequences includes varying the phase of nuclear spin systems in order to reduce the peak amplitude of a received NMR signal. As can be seen by comparing FIGS. 5A–5C, the varying of the phase may occur at any of several times during the imaging process, and the examples shown in FIGS. 5A–5C are merely illustrative of the possibilities. In addition, the phase may be varied at more than one time in the imaging process to produce effects in more than one dimension, in effect combining techniques shown in FIGS. 5A–5C.

In FIG. 5A, the phases of the nuclear spin systems are varied at the beginning of the sequence, as part of the necessary excitation of the nuclear spin systems, as shown in box 22. For imaging, the excited nuclei are then encoded, typically by phase encoding spatial information, as shown in box 24. The resulting NMR signal with reduced peak amplitude is received in box 26.

In FIG. 5B, the nuclei are excited in box 32 and are encoded in box 34. Then, in box 36, the nuclei are refocused, as by a 180° refocusing pulse, and at the same time the phase is varied. As a result, the NMR signal received in box 38 will have a reduced peak amplitude.

In FIG. 5C, the nuclei are again excited in box 42. As a part of the encoding of the nuclei in box 44, the phase is varied. The nuclei may then be refocused, as shown in box 46, after which the NMR signal with reduced peak amplitude is received in box 48.

More specific examples of the sequences shown in FIGS. 5A–5C are described below in relation to specific techniques for varying the phase of the nuclear spin systems. Several techniques are available for varying the phase, and we turn now to a specific discussion of techniques for varying phase which reduce the peak amplitude of a received NMR signal.

II. Inhomogeneous RF Pulses

Figure 6:
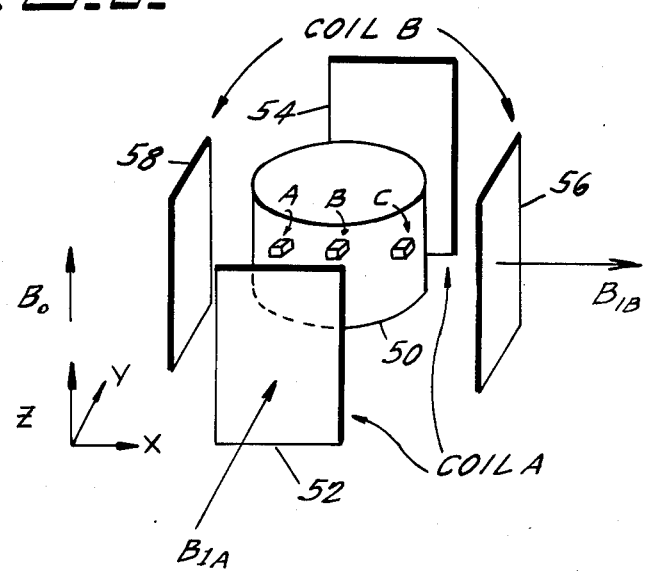
FIG. 6 is a schematic drawing of an arrangement of rf coils which may be used in the invention.
Figure 7:
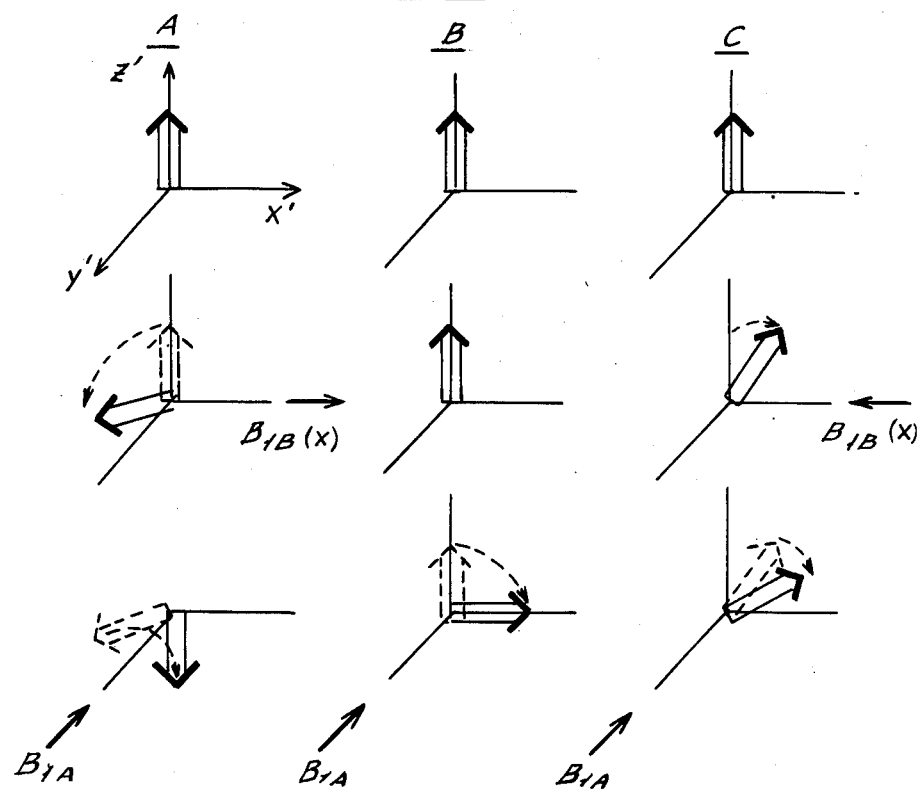
FIG. 7 shows schematically the effect of one method according to the invention on three spin systems in an object.

One technique for varying the phases of the nuclear spin systems is to first prepare the spins by applying an inhomogeneous rf pulse or, in other words, to apply an rf pulse whose amplitude varies spatially across the object being imaged. FIG. 6 shows an rf coil configuration which can be used in this technique. FIG. 7 illustrates how a sequence of pulses applied by the coil configuration of FIG. 6 may affect volume elements of an object being imaged. A similar coil configuration is discussed in the coassigned application directed to "NMR Phase Encoding Using Phase Varying RF Pulses", U.S. application Ser. No. 756,035, filed July 17, 1985, now allowed incorporated herein by reference.

The coil arrangement shown schematically in FIG. 6 shows two rf coils, designated as coil A and coil B, within which an object 50 to be imaged is positioned. Coil A is a saddle-type coil including two halves 52 and 54 which produce a homogeneous magnetic rf field in the Y direction, as shown in FIG. 6. Coil B, on the other hand, includes two halves 56 and 58 which produce an inhomogeneous magnetic rf field which could, for example, be a varying field along the X direction producing zero field at the center point between the coil halves 56 and 58. Coil B may be an rf gradient coil of a well-known design. Although coils A and B are shown in orthogonal relationship in FIG. 6, they need not be orthogonal and may instead lie along the same axis. In addition, additional coils could be provided at different orientations for producing inhomogeneous magnetic rf field along each of the other directions. The object 50 to be imaged is shown between the coils in FIG. 6, and it includes three small elements of spin magnetized nuclei, A, B and C.

FIG. 7 illustrates how rf pulses applied by the coil system of FIG. 6 will affect the spin magnetization in each of the small volume elements, A, B and C. In the first row of FIG. 7, the spin magnetizations of each of the three volume elements are shown oriented along the Z' axis, the position which they would take as a result of the static magnetic field on the Z' axis. Then, as shown in the second row of FIG. 7, an rf pulse applied through coil B changes the orientation of the spin in some of the volume elements. Treating the spin behavior in a rotating frame of reference at an rf reference frequency $f_a$, this pulse is applied along the X' axis, which is arbitrarily assigned to have a phase of zero. As a result, the spin of volume element A is rotated toward the positive Y' axis, while the spin of volume element C is rotated in the opposite direction toward the negative Y' axis. The spin of volume element B is unaffected, however, because, as noted above, a zero field is produced at the center point between the coil halves 56 and 58. As can be seen from the second row of FIG. 7, this will result in a variation in the orientations of the spin systems in the volume elements within the Y'-Z' plane.

Immediately after the end of the inhomogeneous rf pulse applied through coil B, a conventional 90° excitation pulse is applied through coil A, as shown in the third row of FIG. 7. This pulse is applied along the Y' axis, so that it tips all of the spins out of the Y'-Z' plane into the X'-Y' plane, which is conventionally the plane in which the rotating spin magnetization is detected. The spins will be tipped into the X'-Y' plane with different phase, however, corresponding to the differences in orientation which they previously had in the Y'-Z' plane. Furthermore, the excited nuclei will decay, producing a FID signal, resembling that in FIG. 2, above. Thus, FIG. 7 illustrates a two-step process of excitation which also introduces a phase variation into the nuclear spin system. The first step is to apply a pulse which tips the spin axes into different orientations in a plane parallel to the longitudinal axis, while the second step is to apply a pulse which tips all of the spin axes into the transverse plane, each with a phase corresponding to its orientation in the parallel plane.

FIGS. 8A and 8B are timing diagrams showing two phase varying and excitation sequences which may be used in the sequence of FIG. 5A according to the invention, each of which follows the two-step excitation and phase varying process of FIG. 7. In each case, the resulting pulse sequence can be used for two-dimensional imaging using selective excitation of a plane along the Z axis. In FIG. 8A, the phases of the nuclear spin systems are varied by a selective preparation pulse applied through coil B in the presence of a pulsed gradient field $G_z$. The subsequent excitation pulse applied through coil A must than be applied to the same selected plane. In FIG. 8B, on the other hand, the preparation pulse is non-selective, and is applied without the pulsed gradient field, so that only the subsequent excitation pulse applied through coil A is selective. In both FIGS. 8A and 8B, gradient reversal or other appropriate techniques must be applied in the conventional manner to recover the full spin magnetization excited by a selective pulse.

FIGS. 9A-9C are schematic diagrams showing in greater detail an example of a coil configuration like that shown in FIG. 6. FIG. 9A shows one example of homogeneous rf coil A, including coil halves 52 and 54, through each of which current is conducted in the same direction, resulting in a homogeneous rf field. In FIG. 9B, on the other hand, coil halves 56 and 58 conduct current in opposite directions, resulting in an inhomogeneous rf field, at the center point of which the field would be zero. The specific phase distribution resulting from the application of an inhomogeneous rf pulse through coil B will depend upon the structure of the coil itself. The amount of phase rotation resulting from the inhomogeneous rf pulse will also depend on the power applied through the coil, and the angle of rotation should generally be set such that a full 180° rotation is present at one or more positions according to the phase distribution desired. The phase distribution itself may be any arbitrary distribution, although the choice will depend upon the imaging method being used and the method being used to recover the corrected phase information in the final imaged data. The arrangement in FIG. 9C shows coils A and B mounted orthogonally, and each connected to appropriate rf driving and detection circuitry through a matching and tuning circuit. Coil A is connected to the power supply by matching capacitor 62 and is tuned by tuning capacitor 64, while coil B is connected to the power supply by matching capacitor 66 and is tuned by tuning capacitor 68. A variety of different coil configurations and connection schemes can be used, however, and the example shown in FIG. 9C is merely illustrative.

The techniques of applying inhomogeneous rf pulses, depending as it does on the physical structure of an inhomogeneous rf coil, has limited flexibility. In contrast, we turn now to a technique for varying the phases of the nuclear spin systems which is much more flexible.

III. Tailored Phase Scrambling Pulses

As noted above, some aspects of the present invention are based upon the discovery that certain specific rf pulses may be used for effectively varying the phases of the nuclear spin systems in an object being imaged. To permit arbitrary selection of a desired rf pulse for varying the phases, however, a flexible technique for obtaining desired rf pulses is necessary. One such technique is to obtain tailored rf pulses by first defining the amplitude and phase spectra of the desired pulse and by then transforming those spectra into the desired real and imaginary components of the corresponding time-varying waveform. Tailored rf pulses generated in this manner are discussed in the coassigned application directed to "NMR Phase Encoding Using Phase Varying RF Pulses", U.S. application Ser. No. 756,035, filed July 17, 1985, now allowed incorporated herein by reference.

FIGS. 10A and 10B illustrate the spectra of pulses which may be used in varying the phase of nuclei. In both cases, the pulses need only contain frequencies within a given range, and outside that range, the amplitude or magnitude of the frequencies may be zero. Within that range, however, either the amplitude or the phase varies in a manner which may be random, as shown in FIGS. 10A and 10B, or may vary in any manner which reduces the peak amplitude of a resulting NMR signal.

The spectrum in FIG. 10A includes a magnitude or amplitude spectrum which varies randomly within the range and a phase spectrum which is constant, and therefore may arbitrarily be treated as zero across the entire range. When the amplitude and phase spectra shown in FIG. 10A are transformed to produce real and imaginary components of a waveform for modulating an rf pulse, the resulting waveform will produce an rf pulse which when applied to a spin system, produces an excitation with an amplitude variation which is dependent on frequency. Therefore, such a pulse applied in the presence of a field gradient such as a pulsed magnetic field gradient will result in variations of the spin rotation angle like those shown in the second row of FIG. 7, because the amplitude of the rf pulse at each frequency will affect the phase of the nuclei in a particular region defined along the direction of the field gradient. Therefore, this amplitude variant rf pulse may be used as the first pulse in a two-step excitation and phase varying process in the same way as the preparation pulse which was applied with the inhomogeneous rf coil as described above in relation to FIGS. 8A and 8B. The amplitude variant rf pulse should be applied, however, through a homogeneous rf coil.

In order to obtain the type of phase variation resulting from the sequence shown in FIG. 7, an amplitude variant rf pulse such as that of FIG. 10A would be applied in the presence of a field gradient. For example, the amplitude variant rf pulse could be used in the sequence of FIG. 11 for two-dimensional imaging with phase scrambling along the X axis. In FIG. 11, the amplitude variant rf pulse (which is not slice selective), is applied in the presence of a gradient field along the X axis. Immediately after the amplitude variant rf pulse, a slice selective 90° excitation pulse as used in two-dimensional imaging is applied in the presence of a field gradient $G_z$ along the Z axis, and with phase orthogonal to the amplitude variant rf pulse in the rotating frame. The result is a pulse sequence resembling that of FIG. 8A, but may be used for single slice imaging. The sequence of FIG. 11, like those of FIGS. 8A and 8B, yields a two-step excitation and phase varying process like that shown in FIG. 7.

FIG. 10B, in contrast to FIG. 10A, shows an amplitude spectrum which is constant across the frequency range. The phase spectrum, however, varies in a generally random manner as a function of frequency. This type of phase variant rf pulse cannot be phase variant along one axis while spatially selective along an orthogonal axis, so that it is not well suited for multislice imaging. It may be used, however, for volume imaging, where no slice selection is attempted, and for single plane spectroscopic imaging, as discussed below.

In the examples discussed above in relation to FIGS. 6 and 11, the phase variation which reduces the peak amplitude of an NMR signal is spatially dependent, because the inhomogeneity of the rf coil in FIG. 6 is a spatial inhomogeneity and because the amplitude variant rf pulse applied in FIG. 11 is applied in the presence of a field gradient which varies spatially. It is also possible, however, to produce the desired phase variation if the local variations in resonant frequency due to chemical shift or due to field inhomogeneity are sufficiently large. Therefore, a phase variant rf pulse such as that of FIG. 10B may be applied without a field gradient in order to perform phase scrambling.

FIG. 12 shows a pulse sequence which could be applied for single plane spectroscopic imaging if line broadening effects such as field inhomogeneity cause an NMR response from the whole object which has a wide range of frequencies. The nuclei in the plane are excited by a slice selective excitation pulse applied in the presence of the field gradient $G_z$ along the Z axis. Phase encoding of spatial information is then performed by appropriate field gradients $G_x$ and $G_y$ along the X and Y axes, respectively. Then a phase variant rf pulse which is a 180° refocusing pulse is applied to obtain an echo at a time $T_E$ after the excitation pulse. If the refocusing pulse has a phase variance like that shown in FIG. 10B, all of the excited spins will be refocused with each isochromatic group of frequencies having a different phase, and the resulting phase scrambling will reduce the peak amplitude of the spin echo. Most imaging magnets produce a substantial field inhomogeneity which causes a wide bandwidth of spin resonance frequencies so that the pulse sequence of FIG. 12 will produce sufficient phase variation to reduce the peak amplitude. In addition, the technique of FIG. 12 may be combined with the other techniques which perform phase scrambling through spatial dependence, as described above, to ensure a reduction of peak amplitude. Furthermore, the peak rf power necessary for the refocusing pulse is reduced by using the phase variant rf pulse.

The technique of applying tailored rf pulses for phase scrambling is especially useful because of its flexibility. One additional technique which may sometimes be useful has also been discovered, as discussed below.

IV. Mistimed Gradient Pulses

A third technique for varying the phases of the nuclei is shown in FIG. 13. As shown in FIG. 13, the pulse sequence, which is a Fourier imaging sequence, begins with an excitation pulse, which may be a 90° excitation pulse. Then, the excited nuclei are phase encoded through a phase encoding gradient. At the same time, a readout gradient is applied so that subsequent phase encoding may be performed by an observation gradient in the same direction. Also, an additional gradient is applied, timed in such a manner as to prevent the complete refocusing of the excited nuclei during a subsequent spin echo. This additional gradient may be an inhomogeneous gradient, as shown, produced by special purpose gradient coils which provide higher order gradient terms. These higher order gradient terms provide a non-linear phase variation, which is desirable because the basic phase variation used for spatial encoding will be a linear variation which will not produce the desired reduction in the peak amplitude of the NMR signal. If an equal and oppoiste gradient is used for phase scrambling, then the gradients will cancel, and the phase scrambling effect will be lost.

FIG. 13 also shows how a 180° refocusing pulse is then applied, followed by an observation gradient during which the NMR signal, a spin echo, will be received and sampled.

V. Phase Correction

After applying one of the phase varying techniques of the invention, it is further necessary to correct for the phase variation. The phase variations may be corrected by simply taking the the magnitude of the received NMR signal. This could be used with any of the methods according to the invention. On the other hand, the technique of taking the magnitude may result in some loss of resolution, in which case a phase correction could be performed for each point in the image using knowledge of the phase variation. The knowledge of the phase variation may be obtained directly from the initial definition of the phase variation, or it may be obtained from a phantom object for which the NMR signal is obtained over the whole imaging volume, the phase then being measured at all points in the resultant image to obtain phase correction information.

VI. Peak Amplitude Reduction

One objective of the methods according to the invention is to obtain a phase variation which reduces the peak signal energy or amplitude of the resulting NMR signal, yet maintains the average power of the signal approximately the same as it would be with no phase variation. FIGS. 14A and 14B are the result of computer simulation studies carried out to investigate the reduction of the peak amplitude of the NMR signal due to phase variation according to the invention. FIG. 14A is a logarithmic plot relating the value of R, a measure of the reduction in peak amplitude, to the value of m, the number of points in the sampled data set, corresponding to the Nyquist frequency. R is defined as:

$$R = \frac{\text{Maximum Signal Amplitude for Constant Phase}}{\text{Maximum Signal Amplitude for Random Phase}}$$

In the one-dimensional case, the object is defined as a rectangular frequency profile of width $M = m(3/5)$, while for the two-dimensional case, the object is defined as a circle of radius $m/3$.

In FIG. 14A, the solid line is the two-dimensional case in which the phase scrambling is random. The resulting slope in this case is $\log_{10}(R)/\log_{10}(m) = 0.43$, while the intercept is $\log_{10}(m) = 0.95$. In theory, random phase modulation should spread the signal power over m points, so that the rms voltage of the signal should be reduced by a factor proportional to the square root of m, and the slope should be approximately 0.5. The difference between the simulation result and this theoretical result is probably due to non-ideal random generation used in the simulation. The intercept results from the difference of the peak amplitude from the rms signal value and also depends on the nature of the frequency distribution of the input signal, as discussed below in relation to FIG. 14B. Based upon these considerations, the value of R is approximated as follows:

$$R = 0.112(m)^{\frac{1}{2}}$$

Figure 15B:
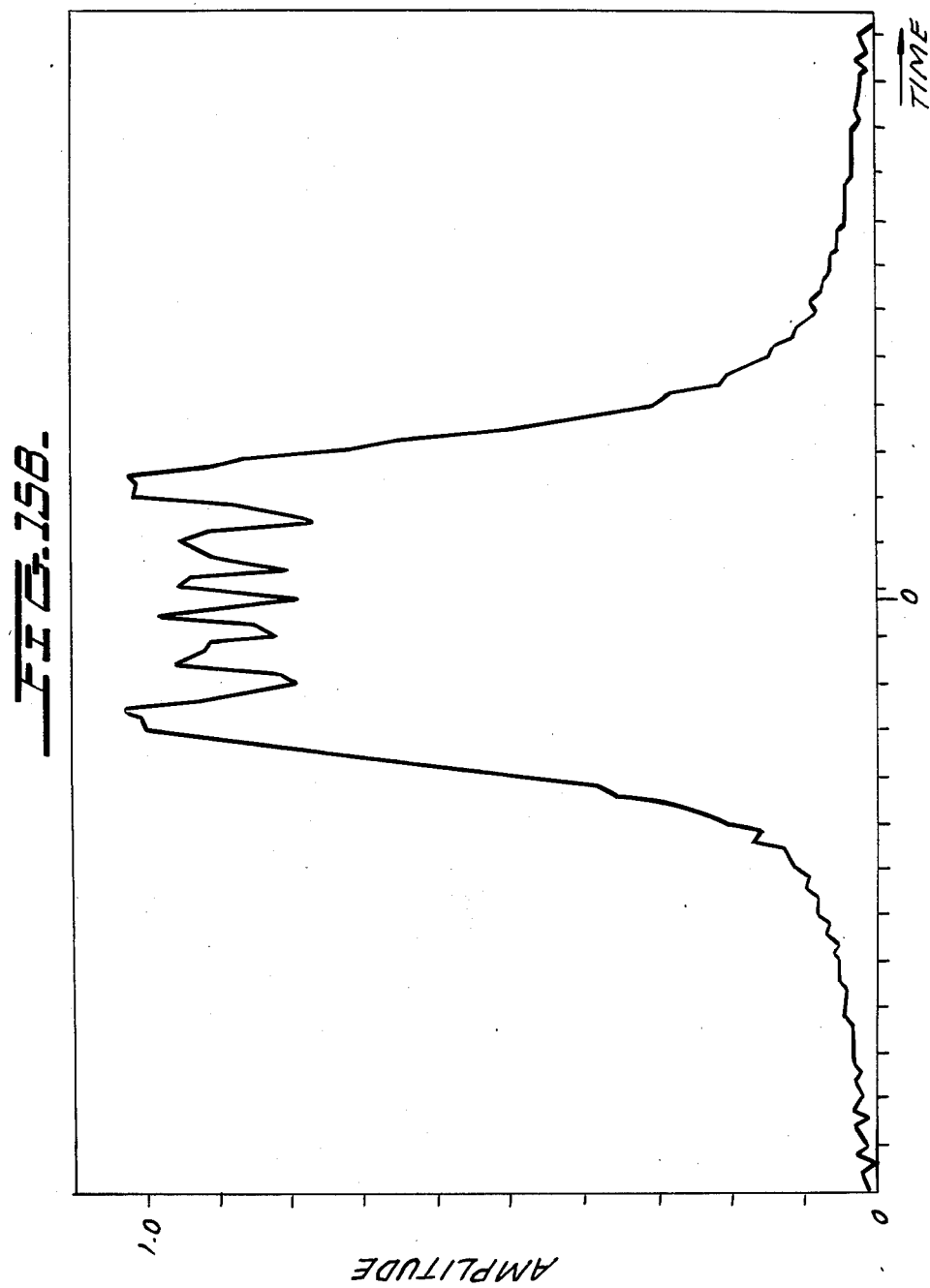
FIG. 15B is a graph of the magnitude of the Fourier transform of the function in FIG. 15A.

FIG. 14A also shows both one-dimensional and two-dimensional cases of frequency modulation using a specific slowly varying random phase function discussed below in relation to FIGS. 15A and 15B. As can be seen in FIG. 14A, this function produces a more nearly ideal slope of 0.49.

FIG. 14B also shows graphically how the reduction in peak amplitude, as measured by R, increases as a relative number of points M/m increases. M/m defines the rectangular frequency profile used for the simulation, which, in this case, is the one-dimensional example. As shown, R is actually proportional to $(M/m)^{\frac{1}{2}}$, which, together with the above equation for R based upon FIG. 14A, indicates that the value of R is proportional to the square root of the number of independently phase encoded points describing the frequency spectrum. Therefore, it appears that R will depend both on the nature of the phase variation or scrambling function and on the frequency spectrum of the signal.

The selection of a phase variation function is important. Although a random phase variation might theoretically be ideal, in practice it would not be desirable, because the resulting phase variation might be so great across some resolved voxels (or imaging volumes) that a cencellation of magnetization would occur within those voxels with a consequent loss of signal. On the other hand, as has been discussed above, the standard NMR imaging methods, including Fourier imaging, rely on pulsed gradient fields for phase encoding. Therefore, if a phase variation is applied which is equal and opposite to the phase encoding, the two phase variations will cancel, resulting in the maximum possible signal amplitude. It is consequently necessary to avoid linear spatial variations for the phase scrambling, as well as purely random functions.

A random phase variation which varies slowly between neighboring points could be devised, however, which would, for example, result from interpolation of a random phase variation over a number of selected points. It has also been discovered that a phase variation according to a specific function, set forth below, is suitable for phase modulation of a tailored rf pulse. The function is:

$$\text{phase } (n) = \frac{2 \pi a |n|^b}{m}$$

where a and b are coefficients, m is a number of phase distinct segments of the range and n takes the integer values from $-(m/2)+1$ to $m/2$. The above function is a frequency modulated phase variation and is similar to a function which is used in spread spectrum or CHIRP radar in which b takes the value 2. Similarly, a frequency modulated amplitude variation may serve as the spectrum for an amplitude or magnitude variant pulse to be used in the pulse sequence of FIG. 11 to obtain a desired phase distribution. The modulating function may be:

$$\text{magnitude } (n) = \frac{2 \pi a |n|^b}{m}$$

Application of the amplitude variant pulse followed by the 90° excitation pulse results in the desired phase distribution.

In order to evaluate this frequency modulated phase variation function, a computer simulation was run. FIG. 15A shows a profile of a pulse which is phase modulated by this function with $a=0.5$ and $b=2$, but with only the real part of the complex data set plotted. The Fourier transform of the function is shown in FIG. 15B, corresponding to the time varying NMR signal which would result from such a function. As shown in FIG. 15B, the signal energy has been broadened over several points, resulting in a reduced peak amplitude. It is clear that this frequency modulated phase variation function can be used as the method of the invention.

VII. Reduction of FFT Noise

Figure 16:
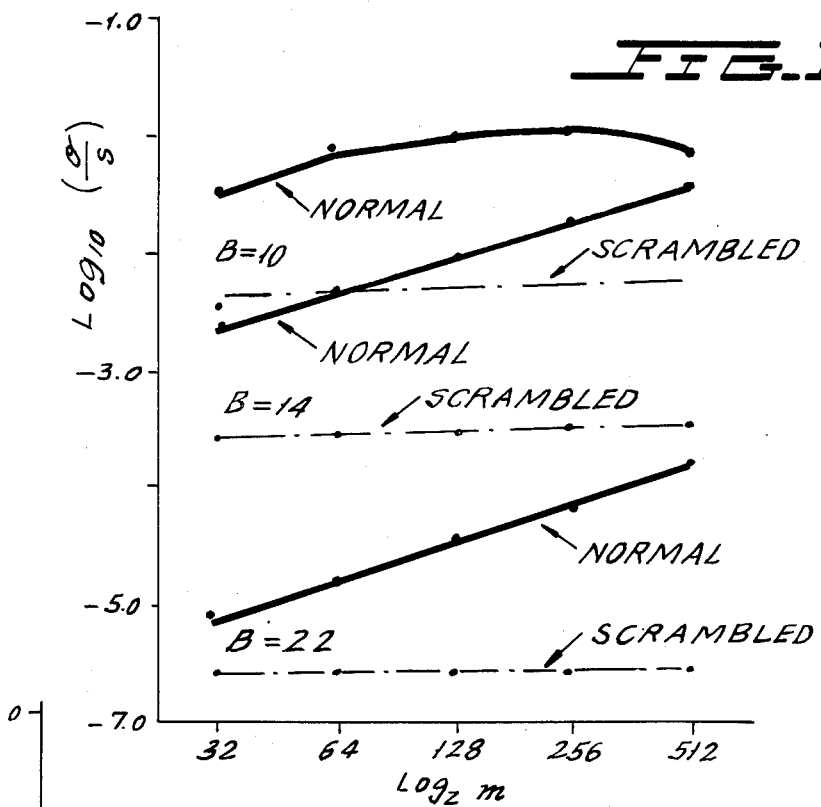
FIG. 16 is a graph showing the relative noise in the two-dimensional FFT for a number of values of the coefficient b.
Figure 17:
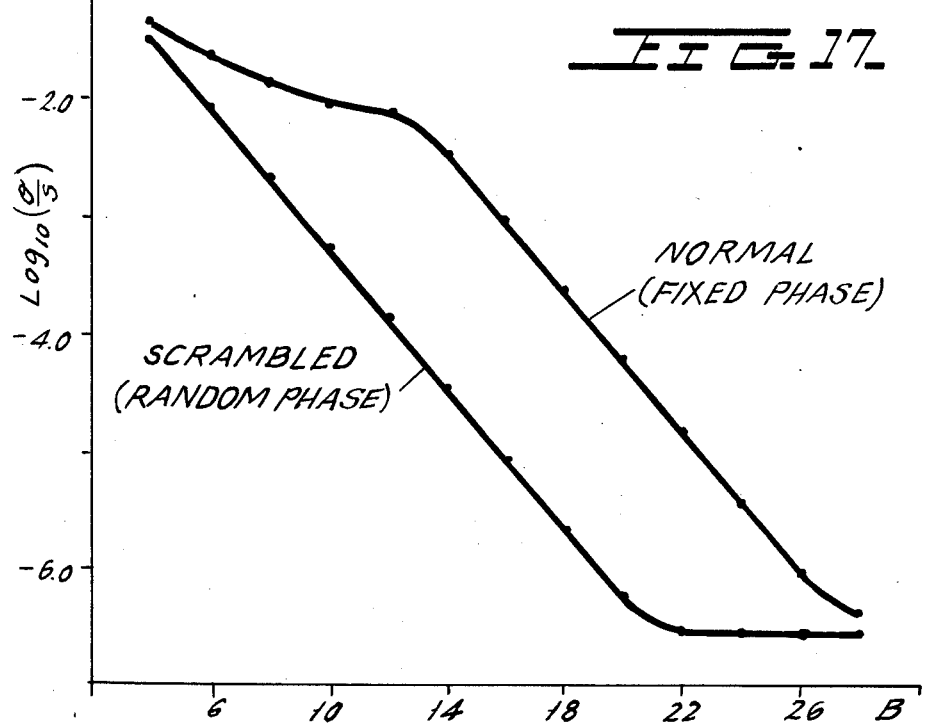
FIG. 17 is a graph of the relative noise variants in the two-dimensional FFT for fixed phase and random phase.

It has been further discovered that phase variation according to the invention produces reductions in truncation noise due to the FFT. FIGS. 16-17 illustrate how the phase variant excitation according to the invention may result in reduced noise from data truncation and the accumulation of errors in the FFT. In general, the noise introduced by the FFT during data processing depends upon the digitization accuracy, roundoff errors, scaling of the data during the FFT and the nature of the data itself. The studies summarized in FIGS. 16-17 were concerned with the error introduced by digitization of the input NMR signal, under the assumption that the subsequent computation is done with sufficient accuracy, disregarding, for example, the effect of choosing between fixed point or floating point data. The effect of digitization error in limiting the dynamic range may be measured by determining the maximum signal to noise (S/N) which may be achieved in the transformed data. Of specific interest are such questions as whether FFT errors may limit the simultaneous observation of proton metabolite signals, such as the signals from lactate, in the presence of water and whether the computational noise effects may be reduced by appropriate selection of excitation waveforms.

The studies summarized in FIGS. 16-17 were performed with a computer simulation to investigate the noise produced during the FFT for a range of input data accuracy and for different FFT data sizes. In general, the phase variant rf pulse discussed above was employed, and all computations were carried out using 32 bit floating point data format, using programs written in FORTRAN. The noise was measured by obtaining the relative noise variance as a fraction of a maximum signal intensity using input data similar to that encountered in NMR imaging. In FIGS. 16-17, the resulting noise is plotted for different values of the digitization accuracy, B, and for different FFT sizes of m points. It is assumed that B is determined by the ADC resolution and that the ADC size is $B+1$, with the extra bit representing the sign, so that a bipolar input is assumed.

FIGS. 16 and 17 relate to a two-dimensional FFT, in which a time varying signal was first generated by taking the Fourier transform of a frequency profile of an object defined as a circle of diameter $m(2/3)$. This data was then normalized and truncated to the accuracy of B binary bits, and the Fournier transform of this data was then taken to recover the original spectrum using an FFT. The noise variance $\sigma$ in the baseline of the magnitude of the resultant data was then found, and normalized by the maximum signal amplitude, S, to obtain the data shown in the figures. Simulations were performed, a normal simulation with the phase constant and equal to zero and a scrambled simulation with random phase varying between +180° and −180°.

FIG. 16 illustrates how the computational noise variance increases with m for the phase constant case, as a function of the square root of m. With random phase, on the other hand, the noise increases only slightly with m. FIG. 17 shows that the computational noise decreases as B increases, or, in other words, as the input signal is obtained with increasing accuracy. The noise reaches a lower limit, however, which is determined by the accuracy of the 24 bit mantissa of the floating point data format used. FIGS. 16–17 show that the noise is reduced when the phase variation technique of the invention is used, and that the reduction is greater as m increases and is relatively constant for any given value of m across a wide range of values of B.

Figure 18A:
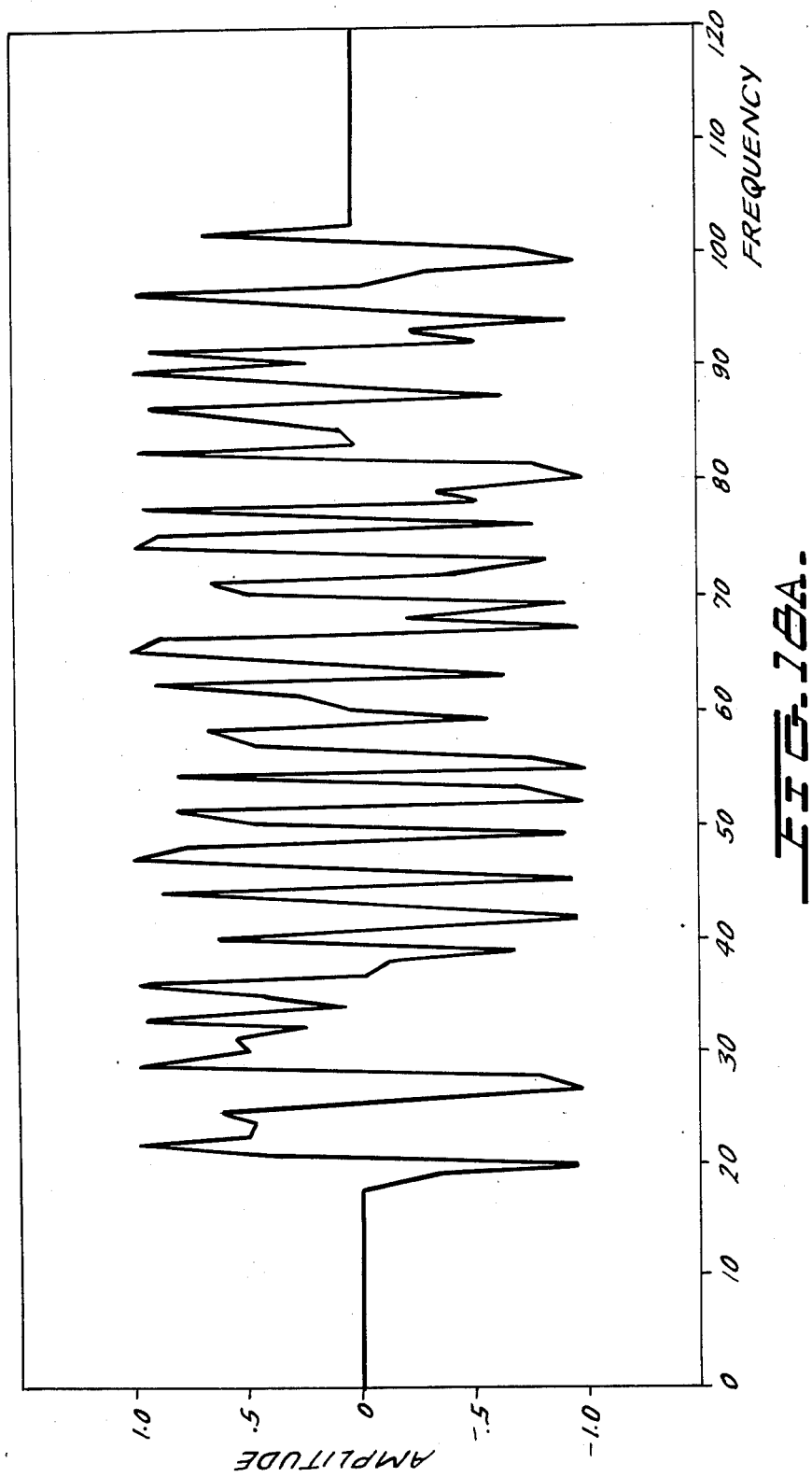
FIG. 18A is a graph showing a profile from a two-dimensional simulation showing the real part of the object following random phase scrambling.

FIGS. 18A–18C show representative data from the computer simulation discussed above in relation to FIGS. 16–17. FIG. 18A shows the real part of the complex frequency spectrum through the center of the object with a phase scrambling pulse according to the present invention applied. FIGS. 18B and 18C compare the data resulting from the two-dimensional FFT with a 128×128 image (m=128) and with B=10. No smoothing of the data was performed, and the data in FIGS. 18B and 18C is only magnitude data. In FIG. 18B, a constant phase was defined, and significant noise appears in the profile. Note that the data long the left baseline is plotted with a scale magnified by a factor of 10. In FIG. 18C, on the other hand, the phase was randomly scrambled, and the resulting noise is much reduced. Along the top of the profile, no noise is visible, and along the lower left baseline, magnification of the scale by a factor of 100 still shows relatively little noise compared with that shown in FIG. 18B.

The use of phase variation or scrambling is therefore effective both to reduce the peak amplitude of an NMR signal and also to reduce the noise generated during the FFT computation as a result of inadequate digitization.

VII. Miscellaneous

It should be pointed out that the processing of NMR information typically includes filtering of the frequency data by multiplying the time data with a filter function or an apodization function. This technique should not be used with phase variation according to the present invention because the convolution function, in the frequency domain, must be complex and will differ for different frequencies. This convolution function cannot be faithfully represented as a function of time, so that any smoothing which is necessary must be carried out by convolution on the final frequency data, which adds a minor overhead to the processing time because convolution in the frequency domain may take more time than multiplication in the time domain.

The method of the invention permits a greater amount of information to be obtained in a finite time period, because the peak amplitude of the NMR signal is reduced. As a result, the receiver can be used with increased gain, and improved efficiency is possible without increasing the dynamic range of the receiver system. A number of variations on the method of the invention may be employed, each of which will result in the reduction of the peak amplitude of the NMR signal.

The pulse and switching sequences of the present invention may be implemented on most commercially available NMR imaging systems. One example of such a system is described in coassigned application directed to "NMR Fourier Imaging from Multiple Echoes", Ser. No. 826,079, filed Feb. 4, 1986 now allowed, which is a continuation-in-part of Ser. No. 616,283 filed June 1, 1984, now abandoned, incorporated herein by reference. A more general discussion of the requirements of such a system may be found in A. A. Maudsley, S. K. Hilal and H. E. Simon, "Electronics and Instrumentation for NMR Imaging", *IEEE Transactions on Nuclear Science*, Vols. NS-31, No. 4 (August, 1984), pp. 990–993.

Although the present invention has been described in connection with a plurality of preferred embodiments thereof, many other variations and modifications will now become apparent to those skilled in the art. It is preferred, therefore, that the present invention be limited not by the specific disclosure herein, but only by the appended claims.

What is claimed is:

1. A method of receiving NMR signals comprising:
   exciting the nuclei of at least some of the atoms of an object during a first time interval to produce an NMR during a second time interval following the first time interval;
   varying the phase of the nuclei of at least some of the atoms of the object to reduce the ratio of the peak amplitude of the received NMR signal to its average power; and
   receiving at least part of the NMR signal during the second time interval.

2. The method of claim 1 in which varying the phase of the nuclei comprises applying a spatially inhomogeneous rf pulse to the object.

3. The method of claim 2, further comprising applying a pulsed gradient field during the inhomogeneous rf pulse for selecting a slice of the object in which the phase of the nuclei of at least some of the atoms is varied.

4. The method of claim 2 in which exciting the nuclei comprises applying a homogeneous rf pulse after the inhomogeneous rf pulse.

5. The method of claim 1 in which varying the phase of the nuclei comprises applying a phase scrambling rf pulse to the object, the phase scrambling rf pulse including a plurality of frequencies and having a respective phase and a respective amplitude for each of the frequencies, one of the respective phase and the respective amplitude varying with frequency for varying the phase of the nuclei.

6. The method of claim 5 in which the respective phases of the frequencies together define a phase spectrum and the respective amplitudes of the frequencies together define an amplitude spectrum, the method further comprising defining the phase spectrum and the frequency spectrum and transforming the phase spectrum and the amplitude spectrum to obtain a time-varying rf pulse waveform having real and imaginary components, the applying of the phase scrambling rf pulse comprising applying the real and imaginary components of the rf pulse waveform to the object.

7. The method of claim 5 in which the frequencies of the phase scrambling rf pulse cover a range of frequencies each having the same respective phase, the respective amplitudes of the frequencies within the range varying with frequency.

8. The method of claim 7, further comprising applying a pulsed gradient field during the phase scrambling rf pulse for varying the phase of the nuclei of at least some of the atoms.

9. The method of claim 8 in which exciting the nuclei comprises applying a homogeneous rf pulse after the phase scrambling rf pulse.

10. The method of claim 7, further comprising applying a pulsed gradient field along a first dimension during the phase scrambling rf pulse for varying the phase of the nuclei along the first dimension and applying a slice selecting rf pulse together with a pulsed gradient field along a second dimension orthogonal to the first dimension after the phase scrambling rf pulse.

11. The method of claim 5 in which the frequencies of the phase scrambling rf pulse cover a range of frequencies each having the same respective amplitude, the respective phases of the frequencies in the range varying with frequency.

12. The method of claim 11 in which the pulse scrambling rf pulse is a spatially non-selective excitation pulse.

13. The method of claim 11 in which the phase scrambling rf pulse is a refocusing pulse.

14. The method of claim 11 in which the respective phases of the frequencies in the range vary with frequency according to a slowly varying random phase function obtained by interpolating between a number of points from a purely random function.

15. The method of claim 11 in which the respective phases of the frequencies in the range vary with frequency according to a function which results in a reduction of the ratio of the peak amplitude of the received NMR signal to its average power.

16. The method of claim 1 further comprising encoding NMR information into the phase of excited nuclei by applying at least one pulsed gradient field to the object, the step of varying the phase of the nuclei comprising timing the pulsed gradient field to produce a phase variation.

17. The method of claim 16 in which applying the pulsed gradient field comprises providing high order gradient components.

18. The method of claim 1 further comprising encoding spatial information into the phase of at least some of the excited nuclei.

19. The method of claim 1, further comprising correcting the phase variation in the received NMR signal resulting from varying the phase of the nuclei.

20. The method of claim 19 in which correcting the phase variations comprises obtaining the magnitude of the received NMR signal.

21. The method of claim 19 in which correcting the phase variations comprises obtaining an image containing a plurality of points from the received NMR signal and correcting the phase variation at each point of the image.

22. The method of claim 1 in which the steps of exciting and varying the phase are performed together, the steps of exciting and varying the phase together comprising applying a first pulse for orienting spin axes of different nuclei differently and then applying a second pulse for bringing the spin axes of the nuclei into a single plane with different phases corresponding to their different orientations.

23. The method of claim 22 in which applying the first pulse comprises applying a spatially inhomogeneous rf pulse to the object.

24. The method of claim 22 in which applying the first pulse comprises applying an amplitude variant rf pulse having a plurality of frequencies, and having a respective amplitude for each of the frequencies, the respective amplitude varying with frequency, the amplitude variant rf pulse being applied in the presence of a pulsed magnetic gradient field.

25. A method of NMR imaging, comprising:
exciting the nuclei of at least some of the atoms of an object to produce an NMR signal;
encoding spatial information into at least some of the excited nuclei;
varying the phase of the nuclei of at least some of the atoms of the object to reduce the peak amplitude of the received NMR signal;
receiving at least part of the NMR signal including the encoded spatial information; and
generating an image based on the encoded spatial information.

26. A method of scrambling the phases of a plurality of magnetically resonant spin systems, comprising:
applying a phase scrambling electromagnetic pulse to the spin systems, the pulse including a range of frequencies, each having a respective amplitude and a respective phase, one of the respective amplitude and the respective phase varying with frequency as $$\frac{2 \pi a |n|^b}{m}$$

where a and b are coefficients, m is a number of phase distinct segments of the range and n takes the integer values from $-(m/2)+1$ to $m/2$.

27. The method of claim 26 in which each spin system is the nucleus of an atom, the method further comprising exciting the nuclei of at least some of the atoms to produce an NMR signal, the phase scrambling electromagnetic pulse being applied for reducing the peak amplitude of the received NMR signal.

28. The method of claim 27, further comprising encoding information in the phases of at least some of the nuclei for providing information in the received NMR signal.

* * * * *